United States Patent [19]

Oldendorf et al.

[11] 4,349,076
[45] Sep. 14, 1982

[54] CHANGE-OVER SWITCH WITH DE-CHATTERING DEVICE FOR ELECTRONIC WEIGHING SCALES

[75] Inventors: Christian Oldendorf, Göttingen; Franz-Josef Melcher, Hardegsen, both of Fed. Rep. of Germany

[73] Assignee: Sartorius GmbH, Fed. Rep. of Germany

[21] Appl. No.: 230,810

[22] Filed: Feb. 2, 1981

[30] Foreign Application Priority Data

Feb. 2, 1980 [DE] Fed. Rep. of Germany ....... 3003900

[51] Int. Cl.³ ............................................ G01G 23/00
[52] U.S. Cl. ............................. 177/164; 177/DIG. 3; 307/247 A
[58] Field of Search ...................... 307/247 A; 361/2; 340/365 E; 177/164, DIG. 3

[56] References Cited

U.S. PATENT DOCUMENTS 3,324,306 6/1967 Lockwood .................. 307/247 A X
3,894,247 7/1975 De Jong ..................... 307/247 A X
4,015,142 3/1977 Nagaoka ......................... 307/247 A

FOREIGN PATENT DOCUMENTS 1375336 11/1974 United Kingdom .

*Primary Examiner*—Joseph W. Hartary
*Attorney, Agent, or Firm*—Eric P. Schellin

[57] ABSTRACT

A circuit for electronic weighing scales, for example, for shifting or switching the circuit between two states and at the same time for de-chattering mechanical contacts, wherein the circuit includes two inverted gates with crossed feedback constituting a flip-flop. A first resistor is connected in the feedback from the output of the second gate to the input of the first gate, and a condenser has one electrode connected to constant potential and another electrode connected to the output of the first gate. A second resistor of high impedance is connected between the condenser and the output of the first gate, and an operating contact is arranged between the second electrode of the condenser and the input of the first gate.

9 Claims, 1 Drawing Figure

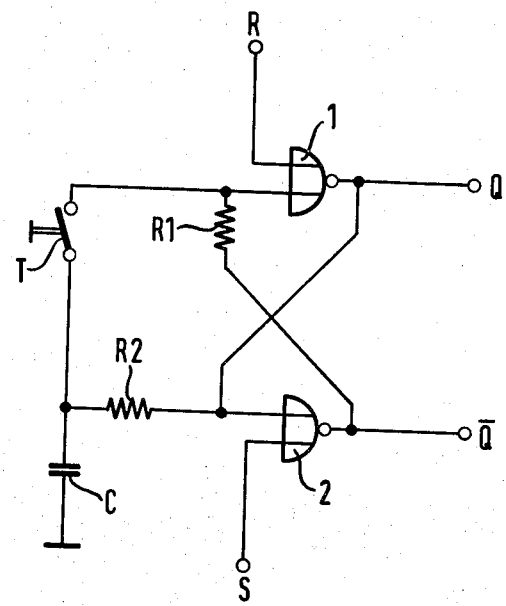

CHANGE-OVER SWITCH WITH DE-CHATTERING DEVICE FOR ELECTRONIC WEIGHING SCALES

BACKGROUND OF THE INVENTION

1. Field of the Invention

The invention relates to a circuit to be employed in electronic scales of shifting or switching between two states, and at the same time for the de-chattering of mechanical contacts. The circuit consists of a flip-flop constituted of two inverted gates with crossed feedback.

The circuits serve in a multiplicity of implements, e.g. in electronic scales, as the intersection or interconnection between external, manually-operated operation elements and the internal digital electronic devices. For example, the specific flip-flop circuit discussed herein can be used to control, in a purely electronic manner, the range-switching circuitry of British Pat. No. 1,375,336, thereby eliminating the electromechanical relay and locking circuits of the patent.

2. Prior Art

A disadvantage of known circuits of the kind with which the invention is concerned consists in that the external operation element must be structured as a mechanical switch so as to bring the flip-flop into one or the other position. When, besides, the shifting operation, e.g. in the remote control or in computer-controlled devices, is also to be released by internal orders, this requires a further flip-flop.

SUMMARY OF THE INVENTION

The invention aims, therefore, at decreasing this expense and especially at providing a circuit for shifting between two states and at the same time de-chattering of mechanical contacts, consisting of a flip-flop constituted by two inverting gates with crossed feedback, which needs only one key switch with a make contact, as a mechanical operation element and which permits the internal release of the shifting function without additional shifting expense.

According to the invention, this is achieved in that in the feedback from the output of the second gate to the input of the first gate a first resistor is inserted, and furthermore, that a condenser is provided, one electrode of which is subject to a constant potential and the other electrode is connected via a second resistor of high resistance to the output of the first gate, and that a key with operating contact is arranged between the second electrode of this condenser and the input of the first gate.

Suitably, in this structure the time constant determined by the second resistor of high resistance and the condenser should amount to about 10 ms.

The first resistor should suitably be of a value lower by the factor 10 than the second resistor.

Since only one input of each gate in the circuit is occupied, it is possible with the use of gates with two inputs to use the second input for the internal shifting of the circuit into a specific shifting state.

The circuit of the invention particularly offers the advantage of range switching for an electronic two range scale.

BRIEF DESCRIPTION OF THE DRAWINGS

The invention is described with the aid of the circuit diagram shown in the following drawing, wherein:

FIG. 1 is a schematic diagram of the circuit of the invention.

DETAILED DESCRIPTION OF THE PREFERRED EMBODIMENT

In FIG. 1, two NOR gates 1 and 2 form a flip-flop through the two crossed feedbacks. In addition, a condenser C is provided, one of whose electrodes is grounded and whose second electrode is connected, via a resistor R2 of high resistance, to the output of gate 1. At condenser C, therefore, a state of charge corresponding to the output voltage of gate 1 (Q) occurs when key T is opened. The time constant of this adjusting process is given by R 2×C. For instance, resistor R2 may have a value of 1 megohm, while condenser C has a value of 10 nf. The time constant becomes then 10 ms.

By actuation of key T, the potential of condenser C is transmitted to the input of gate 1, so that the flip-flop tilts over. Since the resistance of resistor R1 in the feedback from the output of gate 2 to the input of gate 1 is lower, at least by the factor 10, than the resistance of resistor R2 and amounts, e.g. to 20 kohm, the flip-flop is kept at this switching state and also the state of condenser C remains, when key T is closed, nearly unchanged. Even a repeated short opening and closing of key T by the chattering of the contact has no effect, since in this short time (normally less than 1 ms) the potential at condenser C has scarcely changed. Only when key T remains open for some length of time, can condenser C recharge itself with the time constant R2×C of about 10 ms and assure the new potential of the output of gate 1. Only after this recharging process at condenser C can a fresh shift by another closing of key T be triggered.

The second input, marked R, of gate 1 and the second input, marked S, of gate 2 are available to bring by internal orders of digital electronic devices, (not shown) the flip-flop into a specific switching state and keep it there.

Of course, the flip-flop may also be constructed of NAND gates, in which case only the potentials to be applied to the two lines R and S are modified so as to be able to trigger the switching function through key T.

What we claim as new and desire to secure by United States Letters Patent is:

1. A circuit for electronic weighing scales, for switching between two states under the control of mechanical contacts and at the same time obtaining de-chattering of said mechanical contacts, comprising:

a flip-flop constituted by a first and a second inverting gate with crossed feedback, wherein:

a first feedback circuit of said flip-flop comprises a first resistor connected between the output of said second inverting gate and the input of said first inverting gate;

a second feedback circuit of said flip-flop comprises means for directly coupling the output of said first inverting gate to the input of said second inverting gate;

means for switching the state of said flip-flop comprising a condenser having one electrode connected to a source of constant potential, and a second electrode connected to the output of the first inverting gate by a circuit which comprises a second resistor of high resistance connected between the second electrode of the condenser and the output of the first gate; and a key switch, having a make contact, connected between the second electrode of the condenser and the input of the first inverting gate;

whereby each closing of said make contact causes the state of said flip-flop to switch; and whereby contact-bounce of said make contact, immediately after initial closing of said make contact, does not cause the state of said flip-flop to again switch.

2. A circuit as in claim 1, wherein:
the time constant determined by the second resistor of high resistance and the condenser amounts to about 10 ms.

3. A circuit as in one of claims 1 or 2, wherein:
the value of the first resistor is smaller than the value of the second resistor at least by the factor 10.

4. A circuit as in one of claims 1 or 2, wherein:
further inputs are connected with each gate for bringing the circuit into a specific switching state.

5. A circuit as in claim 3 wherein:
further inputs are connected with each inverting gate for bringing the circuit into a specific switching state.

6. A circuit as in one of claims 1 or 2, wherein:
the circuit comprises a range selector for an electronic two-range scale.

7. A circuit as in claim 3, wherein:
the flip-flop circuit controls a range selector for an electronic two-range weighing scale.

8. A circuit as in claim 4, wherein:
the flip-flop circuit controls a range selector for an electronic two-range scale.

9. A circuit as in claim 5, wherein:
the flip-flop circuit controls a range selector for an electronic two-range scale.

* * * * *